US012564014B2

(12) United States Patent
Zhong et al.

(10) Patent No.: US 12,564,014 B2
(45) Date of Patent: Feb. 24, 2026

(54) METHOD AND APPARATUS FOR SUBSTRATE TEMPERATURE CONTROL

(71) Applicant: Applied Materials, Inc., Santa Clara, CA (US)

(72) Inventors: Yaoying Zhong, Singapore (SG); Siew Kit Hoi, Singapore (SG); Bridger Earl Hoerner, Columbia Falls, MT (US)

(73) Assignee: Applied Materials Inc., Santa Clara, CA (US)

( * ) Notice: Subject to any disclaimer, the term of this patent is extended or adjusted under 35 U.S.C. 154(b) by 485 days.

(21) Appl. No.: 18/093,139

(22) Filed: Jan. 4, 2023

(65) Prior Publication Data

US 2024/0222198 A1      Jul. 4, 2024

(51) Int. Cl.
*H01L 21/66* (2006.01)
*H01L 21/285* (2006.01)

(52) U.S. Cl.
CPC .......... *H01L 22/12* (2013.01); *H01L 21/2855* (2013.01); *H01L 22/26* (2013.01)

(58) Field of Classification Search
CPC ...... H01L 22/12; H01L 21/2855; H01L 22/26
See application file for complete search history.

(56) References Cited

U.S. PATENT DOCUMENTS

| | | | |
|---|---|---|---|
| 10,257,887 B2 | 4/2019 | Matyushkin et al. | |
| 2001/0025783 A1 | 10/2001 | Sundarrajan et al. | |

| | | | |
|---|---|---|---|
| 2002/0127852 A1 | 9/2002 | Kawakami et al. | |
| 2006/0027169 A1 | 2/2006 | Tsukamoto et al. | |
| 2007/0227877 A1 | 10/2007 | Wang | |
| 2008/0241778 A1* | 10/2008 | Kulp ................ H01L 21/67109 | |
| | | | 432/5 |
| 2013/0171744 A1 | 7/2013 | Kang et al. | |
| 2015/0371847 A1 | 12/2015 | Cheng et al. | |
| 2018/0374724 A1 | 12/2018 | Parkhe et al. | |
| 2020/0385851 A1* | 12/2020 | Lerner .................. C23C 14/566 | |
| 2021/0022212 A1* | 1/2021 | Cimino ............... H05B 1/0233 | |
| 2021/0132575 A1 | 5/2021 | Yamamoto et al. | |
| 2022/0243332 A1 | 8/2022 | Chandrasekharan et al. | |

FOREIGN PATENT DOCUMENTS

WO      WO 2020-094520 A1      5/2020

OTHER PUBLICATIONS

International Search Report for PCT/US2023/035878, dated Feb. 20, 2024.
International Search Report for PCT/US2023/035875, dated Feb. 20, 2024.

* cited by examiner

*Primary Examiner* — Richard A Booth
(74) *Attorney, Agent, or Firm* — Moser Taboada

(57)      ABSTRACT

Methods and apparatus for controlling substrate temperature includes: measuring a substrate that has undergone a deposition process; analyzing measurements of the substrate to detect a defect of the substrate; and sending a feedback signal to modify a temperature control parameter of a temperature controller used in controlling a temperature of the substrate in the deposition process based on the analyzing if a defect is detected, and not sending a feedback signal to modify the temperature control parameter if a defect is not detected.

18 Claims, 2 Drawing Sheets

1

METHOD AND APPARATUS FOR SUBSTRATE TEMPERATURE CONTROL

FIELD

Embodiments of the present disclosure generally relate to methods, systems, and apparatus for substrate temperature control.

BACKGROUND

AC bias is sometimes used during deposition of aluminum (Al) films (e.g., PVD deposition) on substrates. The AC bias is used to improve Al coverage on the substrate. However, the inventors have observed that AC bias can undesirably increase the temperature on substrates due to bombardment of certain portions of the substrate by argon radicals. The increased temperature can degrade the film morphology by increasing the roughness of the film surface, which can be measured as a reduction in reflective index (RI). Increased film roughness during Al deposition, may be exacerbated during downstream processing involving heat treatment, such as annealing.

Moreover, during Al deposition, outer edges of an electrostatic chuck may become contaminated. Such contamination may interfere with contact between the outer portion of the substrate and the surface of the electrostatic chuck, leading to reduced efficiency in heat transfer and higher temperatures around the outer portion of the substrate.

The inventors propose novel methods and apparatus for substrate temperature control that can improve film morphology and mitigate the effects of reduced efficiency in heat transfer of the electrostatic chuck.

SUMMARY

Methods and apparatus for controlling substrate temperature are provided herein. In some embodiments, a method for controlling substrate temperature includes: measuring a substrate that has undergone a deposition process; analyzing measurements of the substrate to detect a defect of the substrate; and sending a feedback signal to modify a temperature control parameter of a temperature controller used in controlling a temperature of the substrate in the deposition process based on the analyzing if a defect is detected, and not sending a feedback signal to modify the temperature control parameter if a defect is not detected.

In some embodiments, a system for controlling substrate temperature includes: a measurement chamber configured to house a substrate that has undergone a deposition process; a measurement device coupled to the measurement chamber configured to measure at least a portion of the substrate when disposed in the measurement chamber; an analysis device configured to analyze measurements of the substrate and detect a defect of the substrate; and a controller configured to send a feedback signal to modify a temperature control parameter of a temperature controller used in controlling a temperature of the substrate in the deposition process based on the analysis if a defect is detected and to not send a feedback signal to modify the temperature control parameter if a defect is not detected.

In some embodiments, a non-transitory computer readable storage medium having instructions stored thereon that, when executed, perform a method for controlling substrate temperature, wherein the method includes: measuring a substrate that has undergone a deposition process; analyzing measurements of the substrate to detect a defect of the substrate; and sending a feedback signal to modify a temperature control parameter of a temperature controller used in controlling a temperature of the substrate in the deposition process based on the analyzing if a defect is detected, and not sending a feedback signal to modify the temperature control parameter if a defect is not detected.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
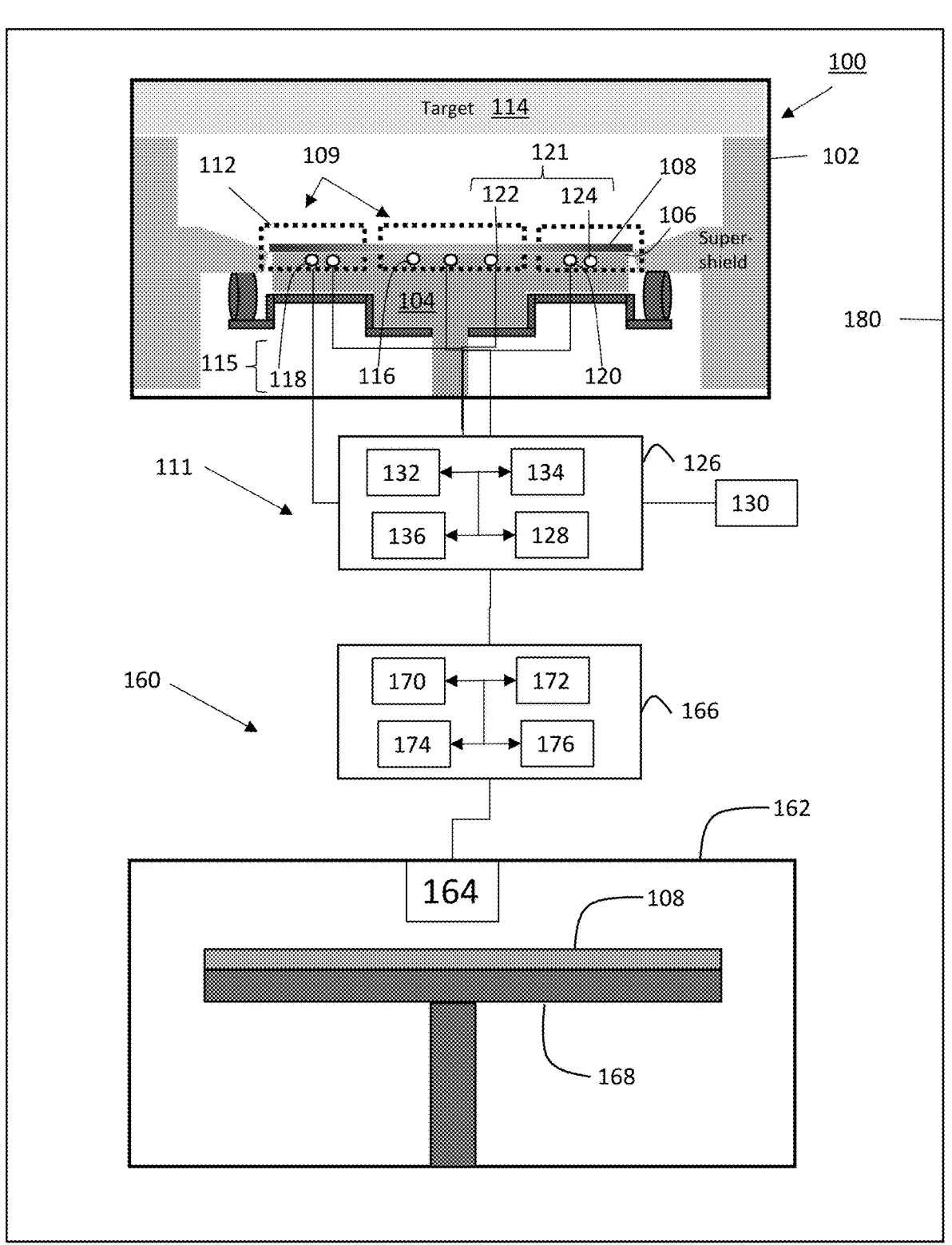
FIG. 1 is a schematic of a system in accordance with embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Embodiments of methods, systems, and apparatus for controlling substrate temperature are provided herein. Such methods, systems, and apparatus can provide substrate temperature control based on defects detected in a processed substrate. By considering the defects in the substrate, the effects of AC bias induced surface degradation and electrostatic chuck contamination can both be reduced, while also avoiding manual heater adjustments, preventive maintenance, and downtime.

FIG. 1 is a schematic view of a system 100 in accordance with embodiments of the present disclosure. In some embodiments the system 100 may include a process chamber 102 and a substrate support 104 disposed in the process chamber 102. The process chamber 102 may be configured to perform substrate processing on a substrate 108. In some embodiments, the process chamber 102 may be a PVD chamber configured to perform PVD deposition processing on the substrate 108. In some embodiments, and as show in FIG. 1, the substrate support 104 may have a support surface 106 to support the substrate 108 during substrate processing in the process chamber 102. In some embodiments, and as shown in FIG. 1, the substrate support 104 may have a plurality of zones 109 (a first zone 110 near a center of the substrate support 104, and a second zone 112 near an edge of the substrate support 104 are shown in FIG. 1). In some embodiments, the substrate support 104 is circular and the plurality of zones include at least one of a circular zone or an annular zone. The system 100 may also include a sputtering target 114 disposed in the process chamber 102 opposite the support surface 106 and the substrate 108. In some embodiments, the sputtering target 114 may include aluminum. The system 100 may also include a plurality of temperature sensors 115 (a first temperature sensor 116, a second temperature sensor 118, and a third temperature sensor 120 are shown in FIG. 1), each of which is configured to sense temperature in a corresponding zone of the plurality of zones 109. For example, in FIG. 1, the first temperature sensor 116 is configured to sense temperature in the first zone 110, and the second temperature sensor 118 and the third temperature sensor 120 are configured to sense temperature in the second zone 112. In some embodiments, the temperature in each zone of the plurality of zones 109 may be monitored by one corresponding temperature sensor located in each zone.

The system 100 may also include a multizone temperature control system 111 for controlling the temperature of the plurality of zones 109 and, thus, a temperature of the substrate 108 during deposition processing in the process chamber 102. In some embodiments, the temperature control system 111 may be configured to independently control the temperature in each zone of the plurality of zones 109. In some embodiments, and as shown in FIG. 1, the temperature control system 111 may include a plurality of temperature elements 121, each of which corresponds to a zone of the plurality of zones 109 (e.g., a first temperature element 122 and a second temperature element 124 are shown in FIG. 1). For example, in the embodiment shown in FIG. 1, the first temperature element 122 corresponds to the first zone 110 and the second temperature element 124 corresponds to the second zone 112.

The temperature elements 121 may include at least one of a heating element or a coolant loop. In some embodiments, a heating element may include a resistive heating element, and in some embodiments a coolant loop may include a fluid channels configured for directing a heat transfer fluid, such as water. In some embodiments, and as shown in FIG. 1, the plurality of zones 109 may be arranged as circles or annular regions of the substrate support 104 and the plurality of temperature elements 121 may be arranged to extend concentrically in one or more zones of the plurality of zones 109.

In some embodiments, and as shown in FIG. 1, the temperature control system 111 may include a temperature controller 126 configured to independently control each temperature element of the plurality of temperature elements 121 based on measurements of the substrate 108, as discussed more fully below. In some embodiments where heating elements are present, the temperature controller 126 may include at least one driver 128 configured as a heater driver connected to the plurality of heating elements and to a supply 130 configured as a power supply, and the driver 128 may be configured to control power output to each heating element. In some embodiments where coolant loops are present, the temperature controller 126 may include at least one driver 128 configured as a flow driver connected to the plurality of separate fluid channels and to a supply 130 configured as a fluid supply, and the driver 128 may be configured to control fluid flow through each fluid channel.

In some embodiments, the temperature controller 126 may include a processor 132 (programmable) that is operable with a memory 134 and a mass storage device, an input control unit, and a display unit (not shown), such as power supplies, clocks, cache, input/output (I/O) circuits, the driver 128, and support circuits 136 coupled to the various components of the processing system to facilitate control of the substrate processing. Support circuits 136 may be coupled to the processor 132 for supporting the processor 132 in a conventional manner.

To facilitate control of the system 100 described above, the processor 132 may be one of any form of general-purpose computer processor that can be used in an industrial setting, such as a programmable logic controller (PLC), for controlling various chambers and sub-processors. The memory 134 coupled to the processor 132 and the memory 134 can be non-transitory computer readable storage medium and may be one or more of readily available memory such as random access memory (RAM), read only memory (ROM), floppy disk drive, hard disk, or any other form of digital storage, local or remote. Charged species generation, heating, deposition and other processes are generally stored in the memory 134, typically as software routine. The software routine may also be stored and/or executed by a second processor (not shown) that is remotely located from the system 100 being controlled by the processor 132.

The memory 134 may be in the form of computer-readable storage media that contains instructions, which when executed by the processor 132, facilitates the operation of the system 100. The instructions in the memory 134 may be in the form of a program product such as a program that implements the method in accordance with embodiments of the present disclosure. The program code may conform to any one of a number of different programming languages. In one example, the disclosure may be implemented as a program product stored on a computer-readable storage media for use with a computer system. The program (s) of the program product define functions of the embodiments (including the methods described herein). Illustrative non-transitory computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such non-transitory computer-readable storage media, when carrying computer-readable instructions that direct the functions of the methods described herein, are embodiments of the present disclosure.

FIG. 1 also shows a substrate measurement system 160 in communication with the system 100 in accordance with embodiments of the disclosure. In some embodiments, the substrate measurement system 160 may be configured to measure the substrate 108 and send a feedback signal to the temperature controller 126 to adjust temperature control parameters (e.g., temperature setpoints) of the temperature controller 126. In some embodiments, the substrate measurement system 160 may be configured to measure at least one of reflective index (RI) of a sputter-deposited surface of the substrate 108, sheet resistance of the substrate 108, film thickness of a sputter deposited film, or resistivity of a portion of the substrate 108. Such measurements may be used to indicate defects of the sputter-deposited surface of the substrate 108. The detected defects are those caused at least in part by substrate temperature during deposition processing in the process chamber 102.

In some embodiments, the substrate measurement system 160 may include a measurement chamber 162, at least one measurement device 164 configured to measure properties of the substrate 108, and an analysis device 166 configured to determine whether the substrate 108 includes defects or defects resulting from deposition processing. In some embodiments, and as shown in FIG. 1, the measurement chamber 162 may be separate from the process chamber 102. For example, in some embodiments, the measurement chamber 162 and the process chamber 102 may be part of a common cluster tool 180 for processing substrates, such as a PVD Cluster tool available from Applied Materials of Santa Clara, California, in which the substrate 108 may be transferred between the process chamber 102 and the measurement chamber 162. In some embodiments, and as shown in FIG. 1, the substrate 108 may be supported in the measurement chamber 162 by a substrate support 168 so that the substrate 108 is disposed opposite the measurement device 164.

Also, in some embodiments, the measurement device 164 and the analysis device 166 may be remote from one another. Also, in some embodiments, the measurement device 164 and the analysis device 166 may be combined together in a single device. In some embodiments, the measurement device 164 may include a non-contact measurement device.

Such non-contact measurement device may include an image acquisition device (e.g., a camera or a microscope) for acquiring images of at least one portion of the substrate 108 and an image processor for processing acquired images of the substrate 108. In some embodiments, the acquired images may be processed and/or stored locally on the measurement device 164 or remotely (e.g., on a server or in the cloud) from the measurement device 164.

In some embodiments, the measurement device 164 may be configured to measure at least one of reflective index of a deposited surface of the substrate 108, a deposited film thickness, or resistivity of at least a portion of the substrate 108.

The analysis device 166 may analyze acquired and/or processed images to measure and detect defects on the substrate 108. In some embodiments, the analysis device 166 is configured to inspect acquired and/or processed images for the presence of a defect. For example, the analysis device 166 may be configured to compare measurements to predetermined measurements for determining the presence of a defect. In some embodiments, the analysis device 166 may be configured to inspect acquired images for the presence and clarity of an alignment mark on the substrate 108. For example, in some embodiments, the substrate measurement system 160 may be configured to optically identify features (e.g., an alignment mark) on one or more portions of the substrate 108 to detect the presence of a defect and send feedback to the temperature controller 126 based on a detection of a defect.

For example, one or more alignment marks may be present along an outer edge of the substrate 108. A blurry image of the alignment mark(s), which may be optically detected by the substrate measurement system 160, may indicate that the temperature of the substrate 108 at or near the alignment mark was too high during deposition processing in the process chamber 102.

Also, in some embodiments, the non-contact measurement device may be configured to measure resistivity of at least a portion of the substrate 108. The analysis device 166 may compare the resistivity measurements to a predetermined range of acceptable resistivity. A measurement that exceeds a predetermined range of acceptable resistivity may be indicative of a defect caused by substrate temperature being too low during deposition processing, while a resistivity measurement that is less than the predetermined range may be indicative of a defect caused by substrate temperature being too high during deposition processing.

In some embodiments, the analysis device 166 may be configured to determine, for each detected defect, one or more zone of the plurality of zones 109 corresponding to a location of the defect on the substrate 108. For example, in some embodiments, as described above, the analysis device 166 may determine that the temperature in one or more zones of the plurality of zones 109 are at least partial causes of the detected defect.

In some embodiments, to reduce or prevent the detected defects from occurring in subsequent substrates to be processed in the process chamber 102, the analysis device may send a feedback signal to the temperature controller 126 to modify a temperature control parameter of the temperature controller 126. In some embodiments, the temperature control parameter may include a temperature setpoint of one or more zones of the plurality of zones 109 that are determined to be at least partial causes of the detected defect. For example, where the analysis device 166 determines that a defect was the result of a temperature that was too high, the feedback signal may include temperature setpoints that are lower than those used during the substrate processing of substrate 108. Similarly, where the analysis device 166 determines that a defect was the result of a temperature that was too low, the feedback signal may include temperature setpoints that are higher than those used during the substrate processing of substrate 108.

In some embodiments, the temperature control parameters may include tuning parameters for tuning the driver 128 (e.g., heater driver) of the temperature controller 126 to control driver output to one or more of the plurality of temperature elements 121. For example, where the temperature elements 121 include heating elements, the feedback signal may include a signal to adjust power output to one or more heater elements corresponding to a determined location of a detected defect of the substrate. The power output of the heating elements may be adjusted to change the control characteristics and responsiveness of the heater (e.g., control ramp rate, duty cycle, damping, and overshoot.)

In some embodiments, the analysis device 166 may include a processor 170 (programmable) that is operable with a memory 172 and a mass storage device, an input control unit, and a display unit (not shown), such as power supplies, clocks, cache, input/output (I/O) circuits 176, and support circuits 174 coupled to the various components of the processing system to facilitate control of the substrate processing. Support circuits 174 may be coupled to the processor 170 for supporting the processor 170 in a conventional manner.

To facilitate control of the analysis device 166 described above, the processor 170 may be one of any form of general-purpose computer processor that can be used in an industrial setting, such as a programmable logic controller (PLC). The memory 172 coupled to the processor 170 and the memory 172 can be non-transitory computer readable storage medium and may be one or more of readily available memory such as random access memory (RAM), read only memory (ROM), floppy disk drive, hard disk, or any other form of digital storage, local or remote. Substrate measurement and inspection processes are generally stored in the memory 172, typically as software routine. The software routine may also be stored and/or executed by a second processor (not shown) that is remotely located from the analysis device being controlled by the processor 170.

The memory 172 may be in the form of computer-readable storage media that contains instructions, which when executed by the processor 170, facilitates the operation of the analysis device 166. The instructions in the memory 172 may be in the form of a program product such as a program that implements the method in accordance with embodiments of the present disclosure. The program code may conform to any one of a number of different programming languages. In one example, the disclosure may be implemented as a program product stored on a computer-readable storage media for use with a computer system. The program(s) of the program product define functions of the embodiments (including the methods described herein). Illustrative non-transitory computer-readable storage media include, but are not limited to: (i) non-writable storage media (e.g., read-only memory devices within a computer such as CD-ROM disks readable by a CD-ROM drive, flash memory, ROM chips, or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such non-transitory computer-readable storage media, when carrying computer-readable instructions that direct the functions of the methods described herein, are embodiments of the present disclosure.

Figure 2:
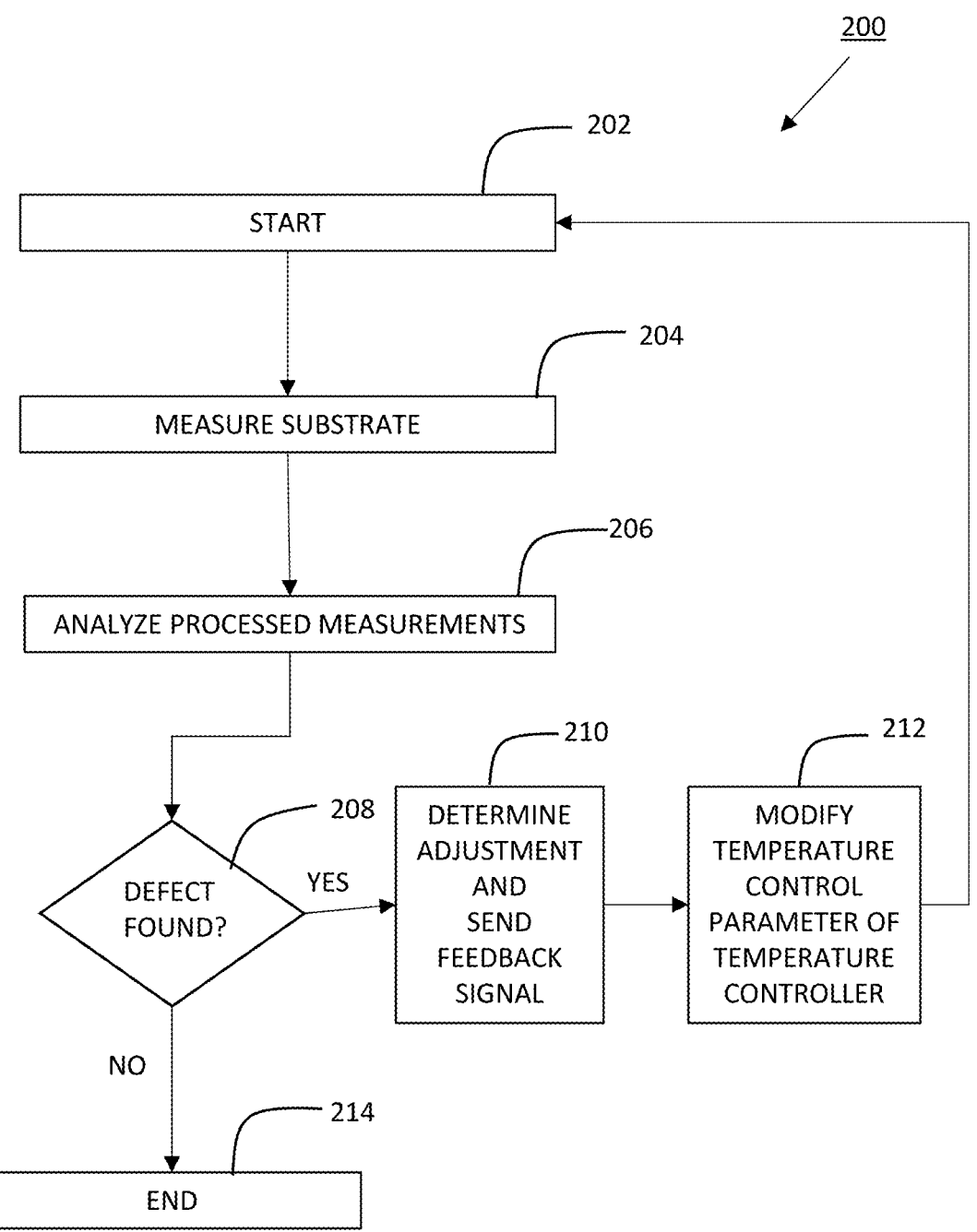
FIG. 2 is a flow chart of a method in accordance with embodiments of the present disclosure.

FIG. 2 shows a method 200 for controlling substrate temperature in accordance with embodiments of the present disclosure. In some embodiments, at 202, the method begins when a substrate (e.g., 108) that has undergone a deposition process in process chamber 102 is received in the measurement chamber 162 and placed on the substrate support 168 in preparation for measurement of the substrate 108. For example, in some embodiments, the substrate 108 may be processed in the process chamber 102 and then transferred within cluster tool 180 to the measurement chamber 162 to be measured. Thus, in some embodiments, the substrate 108 received in the measurement chamber 162 may have a sputter-deposited surface deposited in the process chamber 102.

At 204, the substrate 108 may be measured by the measurement device 164. In some embodiments where the measurement device 164 includes an image acquisition device, such as a camera or microscope, the image acquisition device may acquire images of one or more portions (e.g., sputter-deposited surface) of the substrate 108. As described herein, in some embodiments, the acquired images may be processed and stored locally on the measurement device 164 or remotely from the measurement device 164. Measurements of portions of the substrate may be obtained from the processed images.

At 206, the processed images may be analyzed by the analysis device 166 to detect one or more defects of the substrate 108. For example, the analysis device 166 may inspecting the processed images for the presence of one or more defects of the substrate. In some embodiments, the processed images may be inspected for the presence and clarity of an alignment mark on the substrate. As discussed above, in some embodiments, the measurements may be compared to predetermined thresholds to determine whether one or more defects are present. For example, a defect may be determined to be present if an alignment mark is not visibly present or is measurably unclear. Also, in some embodiments, the analysis device 166 may use any type of image analysis techniques, including use of optical recognition and/or artificial intelligence to identify features and defects on the substrate 108. Also, for each defect detected, one or more zone of the plurality of zones 109 corresponding to the location of the defect may be determined.

At 208, if the analysis device 166 determines that a defect is present on the substrate 108 (e.g., an alignment mark at an edge of the substrate has become blurry), a feedback signal may be sent to the temperature controller 126 at 210 to the temperature control system 111 to modify a temperature control parameter of a temperature controller used in controlling a temperature of the substrate in the deposition process. For example, the temperature control parameter may include temperature setpoints of the one or more zones of the plurality of zones 109 that are determined to correspond to the detected defect. Also, as discussed above, the temperature control parameter may include tuning parameters for the driver 128 of the temperature controller 126. Also, at 210, after the substrate 108 has been measured in the measurement chamber 162, the substrate 108 may be transferred out of the measurement chamber 162 (e.g., to another chamber of the cluster tool 180) to make room in the measurement chamber 162 to measure another substrate that has been processed in process chamber 102.

At 212 the temperature controller 126 may respond to the feedback signal by adjusting the temperature control system 111, such as by adjusting temperature setpoints for one or more zones 109 or tuning the output of the driver 128. The method 200 may then repeat 202-212 for multiple different substrates processed in the process chamber 102 until no defect is found at 208.

At 208, if the analysis device 166 determines that no defect is present on the substrate 108, the method 200 may end at 214, whereupon any substrate 108 in the measurement chamber 162 may be transferred out of the measurement chamber 162 (e.g., to another chamber of the cluster tool 180).

The method 200 may be performed multiple times, such as periodically, or on demand as deemed desirable to maintain process control of deposition processing in the process chamber 102.

The embodiments of the methods, systems, and apparatus described herein can provide substrate temperature control based on defects detected in a processed substrate. By sending feedback signals to the temperature controller 126, temperature control of substrates undergoing processing in the process chamber 102 can compensate for the effects of AC bias induced surface degradation and electrostatic chuck contamination, thereby reducing defects and improving yield.

While the foregoing is directed to embodiments of the present disclosure, other and further embodiments of the disclosure may be devised without departing from the basic scope thereof.

The invention claimed is:

1. A method for controlling substrate temperature, comprising:
   measuring a substrate that has undergone a physical vapor deposition process;
   analyzing measurements of the substrate to detect a defect of the substrate; and
   sending a feedback signal to modify a temperature control parameter of a temperature controller used in controlling a temperature of the substrate in the deposition process based on the analyzing upon detecting a defect.

2. The method of claim 1, wherein measuring the substrate includes acquiring images of at least one portion of the substrate and analyzing includes inspecting acquired images for the presence of the defect.

3. The method of claim 2, wherein analyzing includes inspecting acquired images for the presence and clarity of an alignment mark on the substrate.

4. The method of claim 1, wherein measuring includes measuring at least one of reflective index of a deposited surface of the substrate or resistivity of at least a portion of the substrate.

5. The method of claim 1, wherein, during the deposition process the substrate is supported on a substrate support including a plurality of zones that are independently temperature controlled by the temperature controller, and wherein analyzing includes, for each defect detected, determining one or more zone of the plurality of zones corresponding to a location of the defect on the substrate.

6. The method of claim 5, wherein the temperature control parameter includes a temperature setpoint of one or more determined zones of the plurality of zones.

7. The method of claim 1, wherein the temperature control parameter includes at least one temperature setpoint.

8. A non-transitory computer readable storage medium having instructions stored thereon that, when executed, perform a method for controlling substrate temperature, the method comprising:

measuring a substrate that has undergone a physical vapor deposition process;

analyzing measurements of the substrate to detect a defect of the substrate; and sending a feedback signal to modify a temperature control parameter of a temperature controller used in controlling a temperature of the substrate in the physical vapor deposition process based on the analyzing upon detecting a defect.

9. The non-transitory computer readable storage medium of claim 8, wherein measuring the substrate includes acquiring images of at least one portion of the substrate and analyzing includes inspecting acquired images for the presence of the defect.

10. The non-transitory computer readable storage medium of claim 9, wherein analyzing includes inspecting acquired images for the presence and clarity of an alignment mark on the substrate.

11. The non-transitory computer readable storage medium of claim 8, wherein measuring includes measuring at least one of reflective index of a deposited surface of the substrate or resistivity of at least a portion of the substrate.

12. The non-transitory computer readable storage medium of claim 8, wherein, during the deposition process the substrate is supported on a substrate support including a plurality of zones that are independently temperature controlled by the temperature controller, and wherein analyzing includes, for each defect detected, determining one or more zone of the plurality of zones corresponding to a location of the defect on the substrate.

13. The non-transitory computer readable storage medium of claim 12, wherein the temperature control parameter includes a temperature setpoint of one or more determined zones of the plurality of zones.

14. The non-transitory computer readable storage medium of claim 8, wherein the temperature control parameter includes at least one temperature setpoint.

15. The method of claim 1, wherein the defect is a defect in morphology of a surface deposited on the substrate in the physical vapor deposition process.

16. The method of claim 1, wherein the defect is degradation of the substrate induced by AC bias used in the physical vapor deposition process.

17. The non-transitory computer readable storage medium of claim 8, wherein the defect is a defect in morphology of a surface deposited on the substrate in the physical vapor deposition process.

18. The non-transitory computer readable storage medium of claim 8, wherein the defect is degradation of the substrate induced by AC bias used in the physical vapor deposition process.

\* \* \* \* \*